United States Patent [19]

Beesley

[11] Patent Number: 4,555,677
[45] Date of Patent: Nov. 26, 1985

[54] F.M. AMPLIFIER FOR USE IN I.F. STAGES

[75] Inventor: Graham E. Beesley, Winchester, England

[73] Assignee: Sinclair Research Limited, Cambridge, England

[21] Appl. No.: 596,270

[22] Filed: Apr. 3, 1984

[30] Foreign Application Priority Data

Apr. 22, 1983 [GB] United Kingdom ................. 8311071

[51] Int. Cl.⁴ ............................................. H03F 3/04
[52] U.S. Cl. .................................... 330/302; 330/310
[58] Field of Search .................... 330/53, 54, 290, 310, 330/311, 302–335

[56] References Cited

U.S. PATENT DOCUMENTS 4,268,797  5/1981  Buck et al. ........................ 330/310

Primary Examiner—James B. Mullins
Assistant Examiner—G. Wan
Attorney, Agent, or Firm—Memel, Jacobs, Pierno, Gersh & Ellsworth

[57] ABSTRACT

An amplifier for use in the I.F. stages of an F.M. radio receiver comprises several identical direct-coupled stages 2,4,6 each comprising common emitter transistors 8 and inductive loads 10.

5 Claims, 1 Drawing Figure

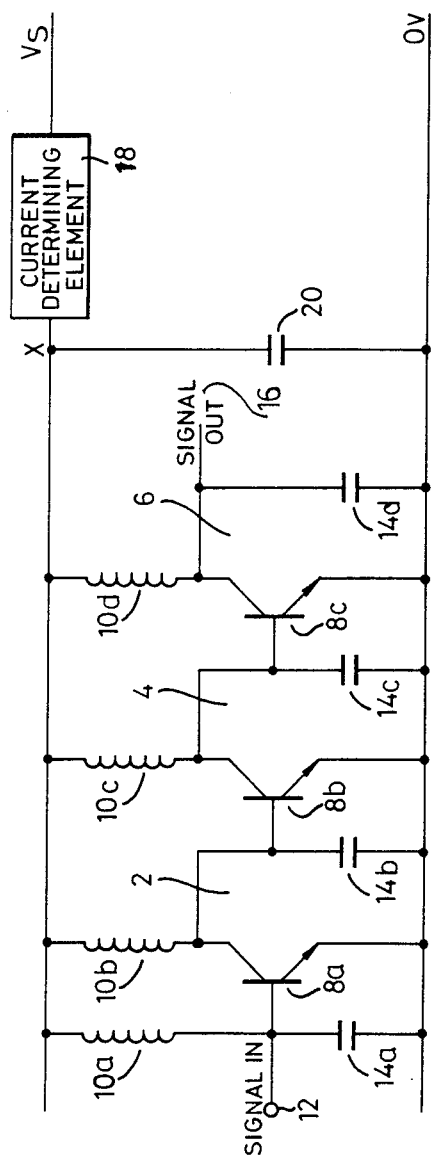

F.M. AMPLIFIER FOR USE IN I.F. STAGES

BRIEF DESCRIPTION OF THE INVENTION

This invention relates to amplifier circuits, particularly for use in the I.F. stages of F.M. radio receivers.

With the desire in the electronics industry for the miniaturisation of components and circuits, an amplifier arrangement that uses a minimal number of components and which can be driven at low voltage is clearly of interest. We have now devised such a circuit, which is capable of being biassed from a single miniature battery such as employed in electronic watches. The circuit may be employed in a very compact F.M. radio receiver.

According to the invention we provide an amplifier comprising a plurality of direct-coupled common emitter bipolar transistor amplifier stages and a biassing means comprising a pair of common voltage rails for said stages, each stage having an inductive load connected between the collector of its respective transistor and one of the common voltage rails and the emitter of its respective transistor being directly-coupled to the other common voltage rail.

The amplifier stages are preferably identical and each contain a single transistor as the amplifying element.

A common current determining element is preferably placed in series with one rail of the voltage supply and typically supplies a regulated current for the amplifier stages. The element may be a resistor, or an active device such as an f.e.t.

DESCRIPTION OF THE DRAWING

A preferred embodiment of the invention will now be described with reference to the accompanying drawing, which is a circuit diagram of a low voltage amplifier for use in the I.F. stages of a miniature F.M. radio receiver.

Referring to the drawing, the circuit comprises three identical direct-coupled amplifier stages 2, 4, and 6, each comprising transistors 8a-8c with the emitters directly-connected to the ground rail of the voltage supply and with inductive loads 10b-10d between each transistor collector and the supply voltage rail $V_S$. A further inductor 10a is provided at the signal input point 12. Capacitors 14a-14d extend to ground from the base of each transistor and also at the signal output point 16. A single current determining element 18 (e.g. a resistor) common to the amplifier stages is provided in the supply voltage rail $V_S$, and a further capacitor 20 extends between the supply rail at X to ground. At point X, the voltage is typically 0.7 volt.

In use, the collector-emitter and base-emitter voltages are equal for all stages. This provides equal collector currents (for identical transistor types) and enables the single element 18 to be employed to determine the total current. The arrangement provides a minimum node amplifier suitable for the low voltage operation as described. The capacitors 14a-14d are optional.

I claim:

1. An amplifier comprising a plurality of direct-coupled common emitter bipolar transistor amplifier stages connected in cascade and a biassing means comprising a pair of common voltage rails for said stages, each stage having an inductive load connected between the collector of its respective transistor and one of the common voltage rails and the emitter of its respective transistor being directly-coupled to the other common voltage rail.

2. An amplifier according to claim 1, wherein the stages are identical to one another.

3. An amplifier according to claim 1 or 2 wherein each stage has the base of its respective transistor connected to one of said common voltage rails through a capacitor.

4. An amplifier according to claims 1 or 2, wherein said amplifier functions as part of an F.M. receiver.

5. An amplifier according to claim 3, wherein said amplifier functions as part of an F.M. receiver.

* * * * *